United States Patent

Kume et al.

[11] Patent Number: 5,835,371
[45] Date of Patent: Nov. 10, 1998

[54] BRIDGE TYPE POWER CONVERTER

[75] Inventors: Tsuneo Kume; Toshihiro Sawa; Sumitoshi Sonoda; Kenji Yamada, all of Kitakyushu, Japan

[73] Assignee: Kabushiki Kaisha Yaskawa Denki, Fukuoka, Japan

[21] Appl. No.: 793,346
[22] PCT Filed: Jun. 21, 1996
[86] PCT No.: PCT/JP96/01719
§ 371 Date: Jul. 3, 1997
§ 102(e) Date: Jul. 3, 1997
[87] PCT Pub. No.: WO97/01214
PCT Pub. Date: Jan. 9, 1997

[30] Foreign Application Priority Data

Jun. 23, 1995 [JP] Japan .................................. 7-158142

[51] Int. Cl.⁶ .................................................. H02M 3/24
[52] U.S. Cl. .............................. 363/132; 363/56; 363/74; 363/40
[58] Field of Search ................................. 363/17, 132, 136, 363/98, 56, 74, 40

[56] References Cited

U.S. PATENT DOCUMENTS 4,502,085  2/1985  Morrison et al. ....................... 363/132
4,914,558  4/1990  Flickinger ................................ 363/17

*Primary Examiner*—Shawn Riley
*Attorney, Agent, or Firm*—Kanesaka & Takeuchi

[57] ABSTRACT

A bridge-type power converter has, in each phase, a inductor ($L_1$) connected between a connection point of said two switching elements ($Q_1$, $Q_2$) and an output terminal; capacitors ($C_1$, $C_2$) connected between the output terminal and a positive or negative side of a d.c. bus for changing an output voltage along a curve determined by a phenomenon of resonance with the reactor ($L_1$) when the semiconductors switching elements ($Q_1$, $Q_2$) operate, causing abrupt changes of a voltage at the connection point; diodes ($D_3$, $D_4$) for changing a current path at a time when the resonance goes approximately one quarter of period to thereby stop the resonance; and constant voltage diodes ($ZD_1$, $ZD_2$) for absorbing the energy stored in the inductor ($L_1$) during the resonance.

7 Claims, 5 Drawing Sheets ously. As still another measure, a filter is provided between the inverter and the electric motor. However, if an L-C filter is used, the resistor for damping the continuing oscillation makes a loss. Also, it is necessary to determine a filter constant for individual motors.

BRIDGE TYPE POWER CONVERTER

FIELD OF THE INVENTION

The present invention relates to bridge-type power converters in which one end of a series connection of two semiconductor switching elements each having a parallel diode is connected to the positive side of a d.c. bus while the other end is connected to the negative side.

BACKGROUND ART

In bridge-type power converters such as power inverters, the voltage of a d.c. voltage bus is switched by switching elements to provide an a-c output so that the voltage can change sharply. In order to reduce the switching loss, current ripples, and noise, the speed characteristic of elements has been improved, and the voltage change rate has increased. This raises the following problems.

(1) The abrupt voltage change against the ground produces electromagnetic waves, which interfere with other electronic equipment.

(2) Leak current goes to cables and electric motor windings via parasitic capacity.

(3) If a cable is long, there is a distributed constant circuit, forming a stable wave, and a voltage surge is applied to the electric motor.

(4) The high voltage change rate makes uneven a voltage distribution in the motor windings, applying a high voltage to a portion of the windings, causing insulation deterioration.

As a countermeasure, it is possible to provide a gradient to a driving signal for the gate or base of a main semiconductor element to reduce the switching speed. However, this method increases the switching loss.

As another measure an L-C resonance circuit is provided in the d.c. bus to block the d-c voltage so that the inverter bridge operates in the zero voltage period to avoid the sharp voltage change (see PCT patent application U.S. Ser. No. 87/02489). By this method, however, it is impossible to control continuously the time length of an output voltage.

As still another measure, a filter is provided between the inverter and the electric motor. However, if an L-C filter is used, the resistor for damping the continuing oscillation makes a loss. Also, it is necessary to determine a filter constant for individual motors.

FIG. 1 shows a three-phase voltage inverter main circuit. The bridge circuit is composed of six switching elements $Q_1$–$Q_6$ and six free wheel diodes $D_1$–$D_6$. The characteristics of the switching elements $Q_1$–$Q_6$ determine the on/off switching speed. The voltage at the output terminal is switched in very short time periods, raising the aforementioned problem.

DISCLOSURE OF THE INVENTION

It is an object of the invention to provide a bridge-type power converter which is able to reduce the voltage change rate at switching times of the voltage applied to an electric motor which is driven by the bridge-type power converter.

A bridge-type power converter according to one aspect of the invention includes, in each phase, a inductor connected between a connection point of said two switching elements and an output terminal; capacitors connected between the output terminal and a positive or negative side of said d.c. bus for changing an output voltage along a curve determined by a semiconductors switching elements operate, causing abrupt changes of a voltage at the connection point; diodes for changing a current path at a time when said resonance goes approximately one quarter of period to thereby stop said resonance; and constant voltage diodes such as Zener diodes for absorbing energy stored in said inductor during said resonance.

According to another aspect of the invention there is provided a bridge-type power converter, wherein the constant voltage diodes connected to the positive and negative sides of d.c. bus in each phase of a multiple phase bridge-type power converter developed with the circuit according to claim 1 are replaced by diodes forming a high-voltage or low-voltage priority circuit and diodes forming backward current path, respectively.

According to still another aspect of the invention there is provided a bridge-type power converter, wherein the constant voltage diodes are replaced by a constant voltage circuit which comprises transistors so as to provide a reverse conduction characteristic.

According to yet another aspect of the invention there is provided a bridge-type power converter, wherein the constant voltage diodes are formed by transistors.

According to another aspect of the invention there is provided a bridge-type power converter, which further comprises a chopper circuit for controlling voltages across capacitors which replace the constant voltages diodes and returning absorbed power to said d.c. bus.

According to still another aspect there is provided a bridge-type power converter, which further comprises a.c. terminals connected to an a.c. power source for performing an a.c.-to d.c. power conversion.

According to yet another aspect of the invention there is provided a bridge-type power converter, which further comprises a unit formed by additions to the switching elements and connected between the power converter and an electric motor or a power source.

When the voltage of the output terminal is changed abruptly by switching of the bridge-type power converter, the voltage of the electric motor changes along a cosine curve by resonance and when the motor voltage reaches a certain level, the diodes and the constant voltage diodes provide a clamp function so as to absorb excessive energy. This controls the change rate of the voltage applied to the electric motor and the generation of excessive oscillations.

As has been described above, the change rate of the voltage reduced according to the invention produces the following advantages:

(1) There is less electromagnetic interference.

(2) There is less leak current.

(3) There are fewer standing waves and no or few voltage surges to the electric motor.

Cables can be considered as an L-C distributed circuit so that when the output voltage of an inverter changes abruptly, a progressive wave goes to the electric motor. The impedance of a motor is much greater than that of a cable so that the impedance of a point between the cable and the motor can be considered to be open. Consequently, a reflected wave is generated at the motor terminal, forming a standing wave by combination of the progressive and reflected waves. Consequently, the motor terminal voltage goes up and can reach twice the output voltage of the inverter. When the change rate dv/dt of the inverter voltage is reduced, the above phenomenon is controlled so that there is hardly any voltage surge.

(4) The voltages of motor windings are balanced, making the life of the insulation longer.

DESCRIPTION OF THE PREFERRED EMBODIMENT

Figure 1:
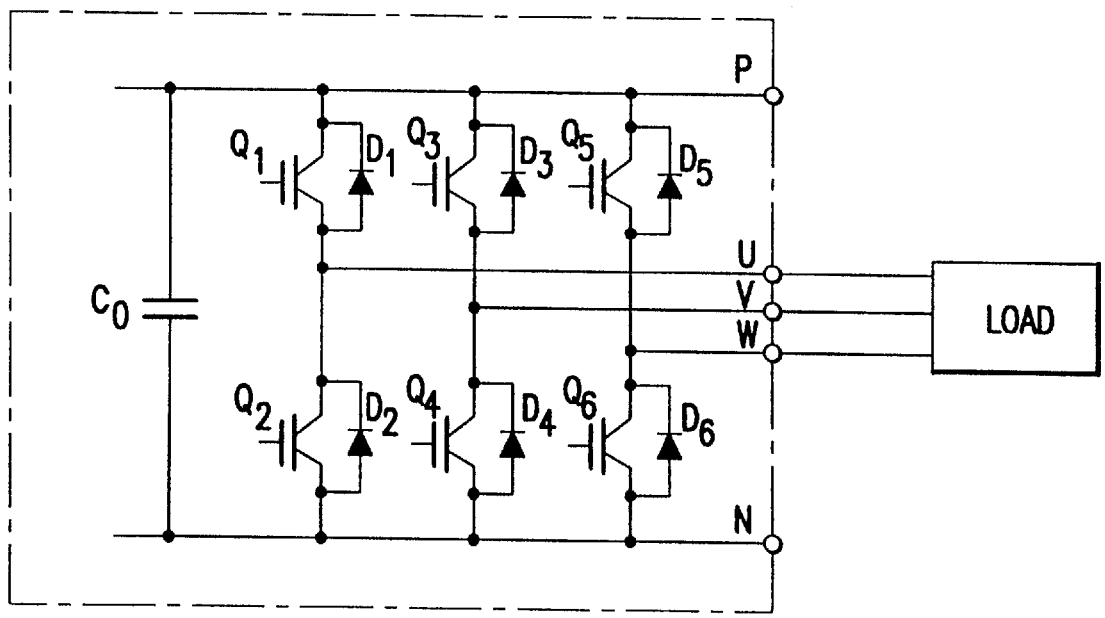
FIG. 1 is a schematic diagram of a three-phase voltage inverter main circuit.
Figure 2:
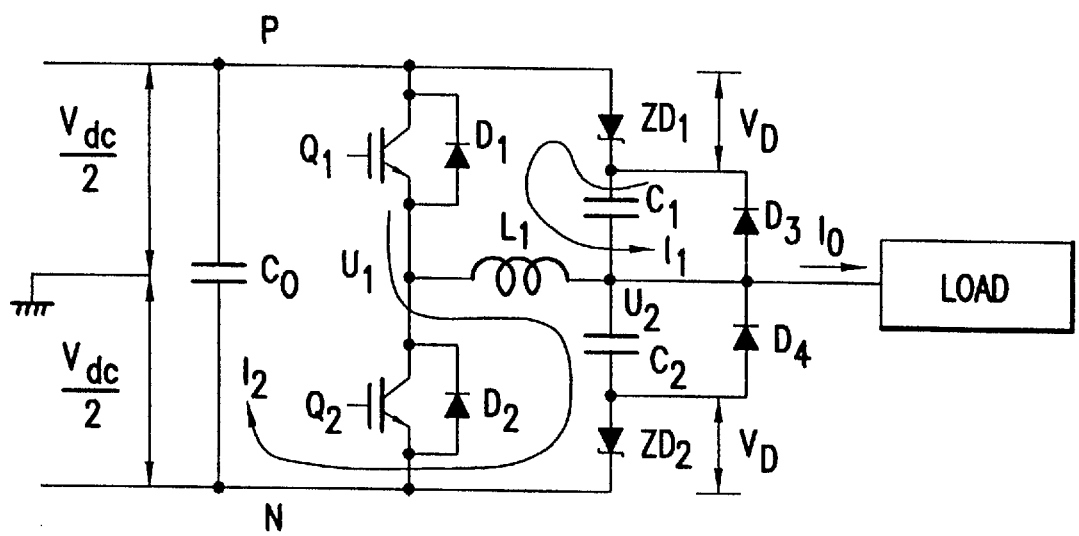
FIG. 2 is a circuit diagram of a single phase of a bridge-type power converter according to an embodiment of the invention.
Figure 3:
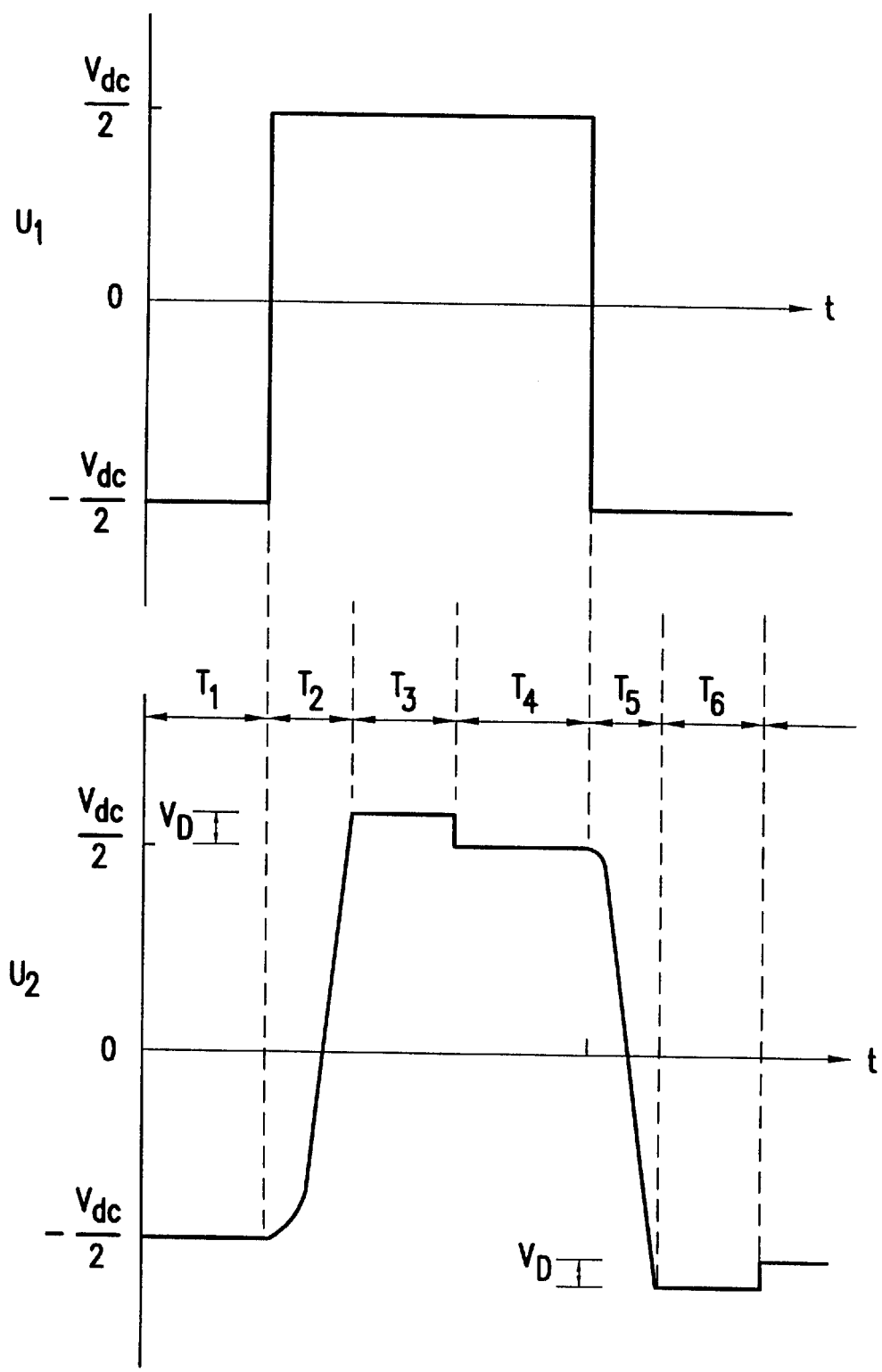
FIG. 3 is a chart showing output voltages of the circuit in FIG. 2.

FIG. 2 shows a single phase of a bridge-type power converter according to this invention. FIG. 3 shows input and output voltage waveforms of the power converter.

This bridge-type power converter includes a capacitor $C_0$, two switching elements $Q_1$ and $Q_2$, two diodes $D_1$ and $D_2$, a coil $L_1$, two capacitors $C_1$ and $C_2$, two diodes $D_3$ and $D_4$, and two constant voltage diodes (Zener diodes) $ZD_1$, and $ZD_2$.

It is assumed that all elements and parts have ideal characteristics. Also, it is assumed that the current through a load or electric motor is constant in short time periods before and after switching and that its direction is expressed by an arrow $I_0$ (for symmetry of the circuit, the opposite direction is omitted).

As FIG. 3 shows, the operation mode can be divided into six time sections $T_1$–$T_6$.

In the time section $T_1$, the transistor $Q_1$ is off and stable, and the current flows to the load from the N bus via the diode $D_2$ and the coil $L_1$. The transistor $Q_2$ is on but the current direction is opposite so that the diode $D_2$ is on. At this point, the capacitor $C_1$ is charged to a voltage (Vdc+$v_D$) where $V_D$ is the voltage of the constant voltage diodes $ZD_1$ an $ZD_2$ and the voltage across the capacitor $C_2$ is 0.

When the transistors $Q_2$ and $Q_1$ are turned off and on, respectively, the time section $T_2$ begins. That is, when the transistors $Q_2$ and $Q_1$ are turned off and on, respectively, the capacitor $C_1$ is discharged and the capacitor $C_2$ is charged. At this point, the load current changes from the diode $D_2$ to the transistor $Q_1$ so that the currents $I_1$ and $I_2$ flow as shown in FIG. 2, establishing two resonance circuits simultaneously. One circuit is $C_1 \to ZD_1 \to Q_1 \to U_1 \to L_1 \to U_2 \to C_1$ and the other is $C_0 \to P \to Q_1 \to U_1 \to L_1 \to U_2 \to C_2 \to ZD_2 \to N \to C_0$. These resonance currents are superimposed so as to increase the current of the transistor $Q_1$ and the coil $L_1$. Consequently, the voltage across the capacitor $C_1$ decreases along a cosine curve while the voltage across the capacitor $C_2$ increases along a cosine curve. The potential at the output terminals $U_2$ increases along with the increasing voltage. When the potential of the output terminal $U_2$ reaches a voltage (Vdc/2+$V_D$), the voltage across the capacitor $C_1$ becomes zero, bringing the time section $T_2$ to an end.

Since the coil $L_1$ stores excessive energy generated by the resonance when the voltage across the capacitor $C_1$ is zero, a circular current $L_1 \to U_2 \to D_3 \to ZD_1 \to P \to Q_1 \to U_1$ continues to flow in the time section $T_3$, and the magnitude decreases at a rate of $V_D/L_1$. During this time $U_2$ is clamped to a potential (Vdc/2+$V_D$). When the circular current becomes zero, the time section ends and $U_2$ has a potential equal to the potential of P.

The state of the time section $T_4$ is stable when the transistor $Q_1$ is turned on. At this point, the voltages across the capacitors $C_1$ and $C_2$ are 0 and (Vdc+$V_D$), respectively.

When the transistors $Q_1$ and $Q_2$ are turned off and on, respectively, the time section $T_5$ starts. The load current changes from the transistor $Q_1$ to the diode $D_2$, establishing two resonance circuits simultaneously. One is $C_2 \to U_2 \to L_1 \to U_1 \to D_2$ (or $Q_2$) $\to N \to ZD_2$ and the other is $C_0 \to P \to ZD_1 \to C_1 \to U_2 \to L_1 \to U_1 \to D_2$ (or $Q_2$) $\to N \to C_0$. The resonance currents are superimposed in such a direction (opposite to the output current $I_0$) as to offset the current of the coil $L_1$. Consequently, the voltage of the capacitor $C_2$ decreases along a cosine curve while the voltage of the capacitor $C_1$ increases along a cosine curve. The potential at the output terminal $U_2$ decreases along with the decrease. When the level of the output terminal $U_2$ reaches −(Vdc/2+$V_D$), the voltage across the capacitor $C_2$ becomes zero, bringing the time section $T_5$ to an end.

When the voltage of the capacitor $C_2$ becomes zero, the coil $L_1$ stores excessive energy by the resonance so that a circular current continues to flow as $L_1 \to U_1 \to D_2$ (or $Q_2$) $\to N \to ZD_2 \to D_4 \to U_2$ in the section $T_6$, and the magnitude decreases at a rate of $V_D/L_1$ (the current of $L_1$ increases toward $I_0$). During this period, $U_2$ is clamped to a potential −(Vdc/2+$V_D$). When the circular current becomes zero, the section ends, bringing the potential of the output terminal $U_2$ equal to the potential of N. When the section $T_6$ ends, the potential returns to the same stable state as the section $T_1$.

In FIG. 2, the constant voltage diodes $ZD_1$ and $ZD_2$ absorb the resonance energy. In practice, it is possible to use a circuit in which parallel diode are connected backwardly to a shunt regulator in which transistors are used to keep the voltage constant.

Figure 4:
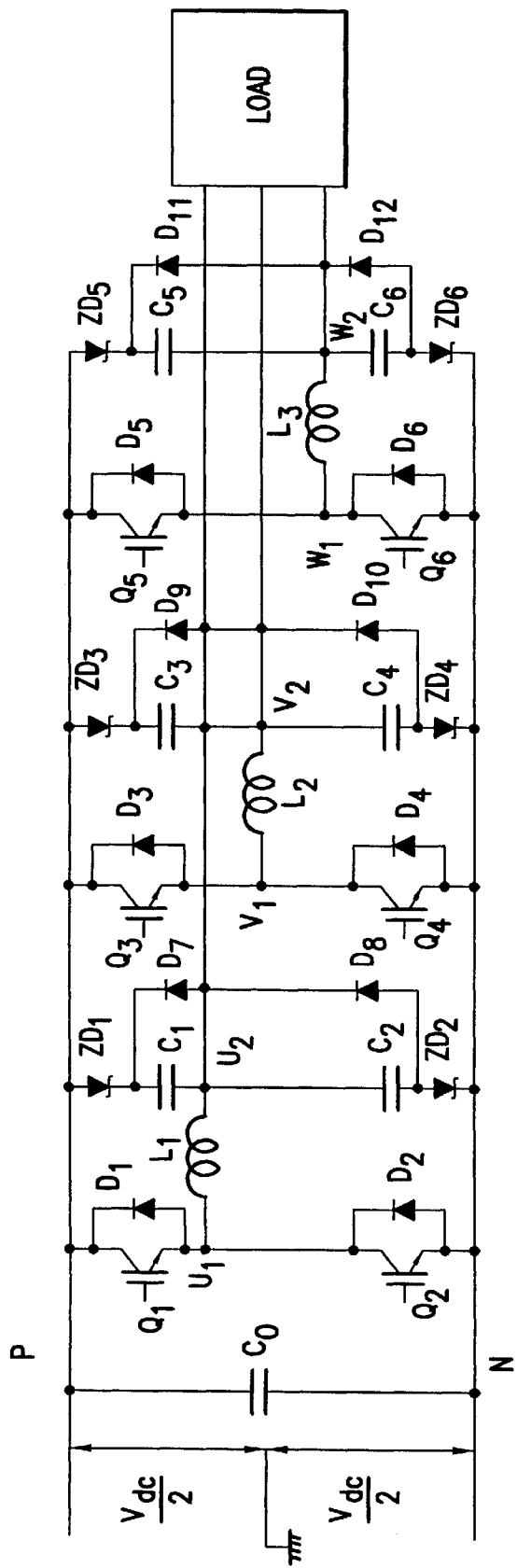
FIG. 4 is a three-phase circuit diagram developed from the circuit of FIG. 2.

FIG. 4 is a circuit diagram of a bridge-type power converter developed from the circuit of FIG. 2. The circuit of a U phase is the same as that of FIG. 2.

Two switching transistors $Q_3$ and $Q_4$, two diodes $D_3$ an $D_4$, a coil $L_2$, two capacitors $C_3$ and $C_4$, two diodes $D_9$ and $D_{10}$, and two constant voltage diode $ZD_3$ and $ZD_4$ form a V-phase circuit while two switching transistors $Q_5$ and $Q_6$, two diodes $D_5$ and $D_6$, a coil $L_3$, capacitors $C_5$ and $C_6$, two diodes $D_{11}$ and $D_{12}$, and two constant voltage diode $ZD_5$ and $ZD_6$ form a W-phase circuit.

Figure 5:
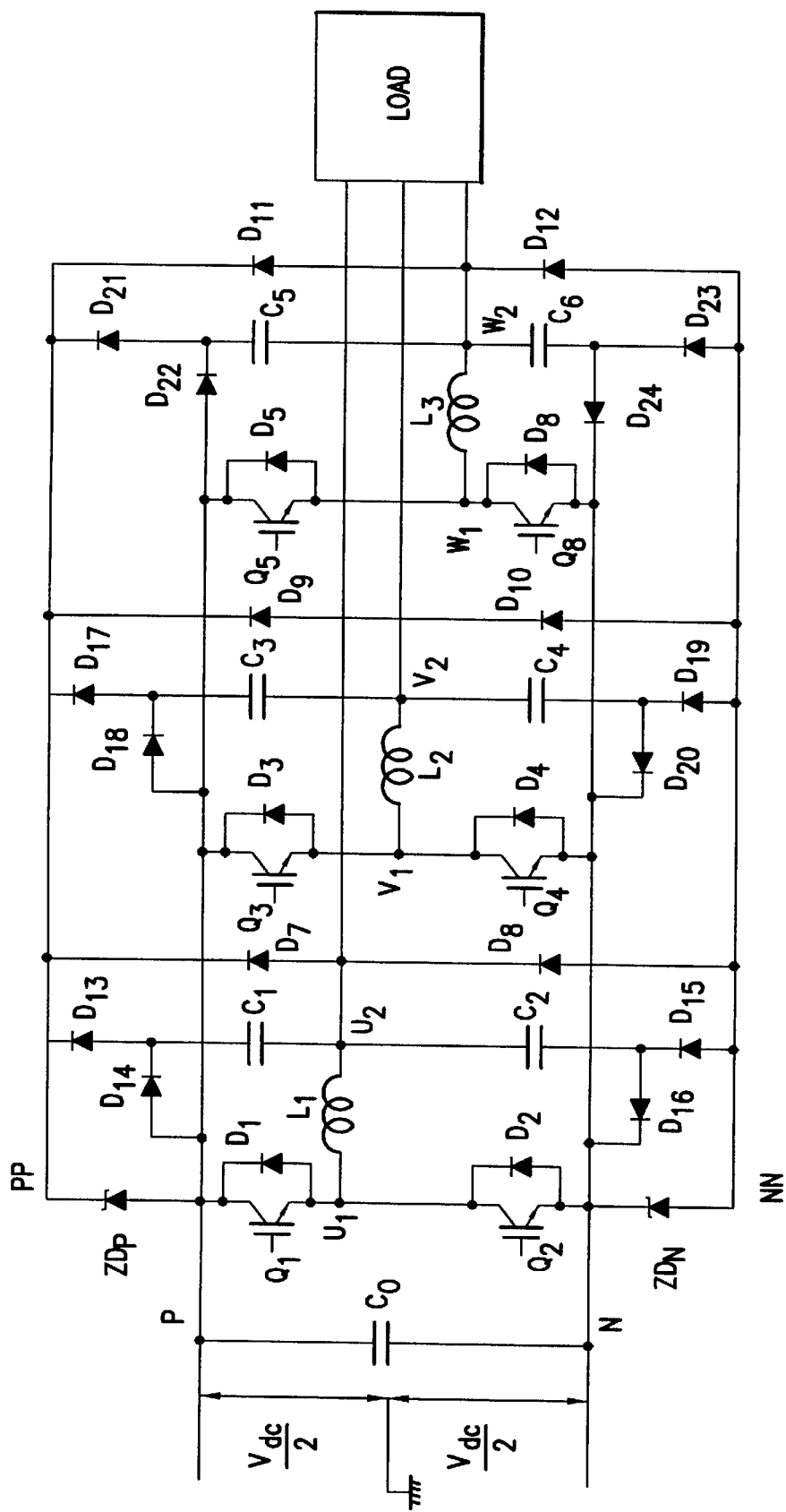
FIG. 5 is a circuit diagram of a three-phase bridge-type power converter having a common constant voltage circuit.

In FIG. 5, the constant voltage diodes $ZD_1$, $ZD_3$, $ZD_5$ connected to the positive side of d.c. bus P in FIG. 4 are replaced by a common voltage diode $ZD_P$ by means of a high-voltage priority circuit consisting of diodes $D_{13}$, $D_{17}$, an $D_{21}$ an a back current circuit consisting of $D_{14}$, $D_{18}$, and $D_{22}$ while the constant voltage diodes $ZD_2$, $ZD_4$, an $ZD_6$ connected to the negative side d.c. bus N are replaced by a common voltage diode $ZD_N$ by means of a low-voltage priority circuit consisting of $D_{15}$, $D_{19}$ an $D_{23}$ and back current circuit consisting of diodes $D_{16}$, $D_{20}$, and $D_{24}$.

In practice, like snubber energy processors or circuits for processing commutation energy in current inverters $ZD_P$ and $ZD_N$ are made as follows.

(1) Shunt Regulators: Transistors are used to keep the voltage constant.

(2) Combination of Capacitor and Chopper: The capacitor absorbs pulses and energy is returned to P/N bus by a chopper so as to keep the voltage constant.

Figure 6:
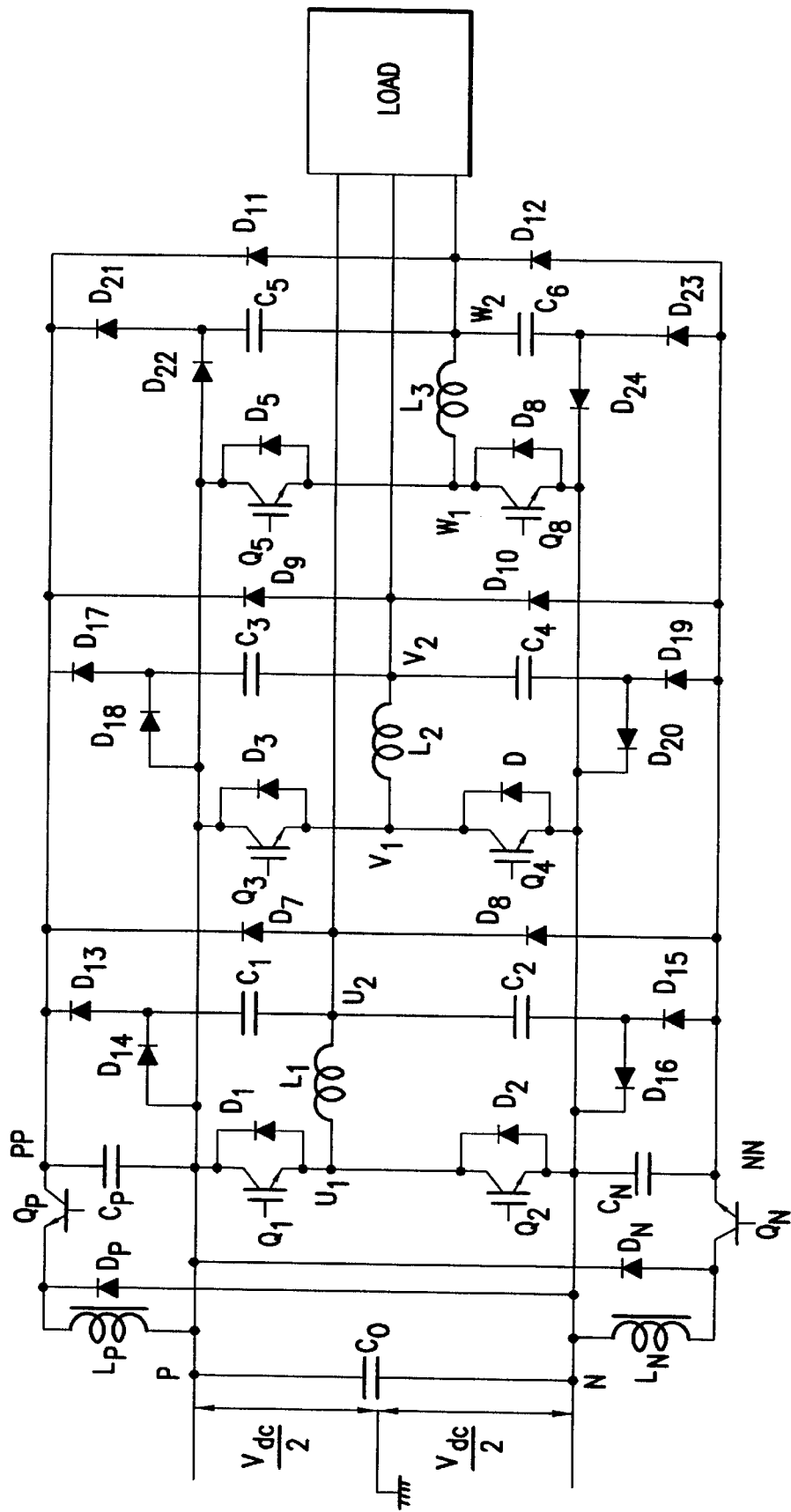
FIG. 6 is a circuit diagram of a three-phase bridge-type power converter having a power regenerative function.

FIG. 6 shows a circuit in which the constant voltage diodes $ZD_1$ and $ZD_2$ of the inverter-type power converter in FIG. 5 are replaced by capacitors $C_P$ and $C_N$, diodes $D_P$ and $D_N$, and transistors $Q_P$ an $Q_N$, and coils $L_P$ and $L_N$ so as to return by choppers excessive energy generated by resonance to the d.c. bus. That is, the energy absorbed by the capacitors $C_P$ and $C_N$ is returned to the respective d.c. circuits by a chopper consisting of the transistor $Q_P$, the diode $D_N$, and the coil $L_P$ and a chopper consisting of the transistor Q, the diode $D_N$, and the coil $L_N$.

As has been describe above, the bridge-type power converter is able to convert d.c. to a.c. to drive an a.c. load and a.c. to d.c. when the a.c. terminals are connected to an a.c. power source and control the current waveform of the power source. The device according to the invention is able to reduce an impact which sharp voltage changes have on a load.

What is claimed is:

1. A bridge-type power converter comprising, in each phase,;
    a series connection of two semiconductor switching elements each having a backward parallel diode, one end of which is connected to a positive side of a d.c. bus and the other to a negative side of the d.c. bus,
    an inductor connected between a connection point of said two switching elements and an output terminal;
    capacitors connected between said output terminal and a positive or negative side of said d.c. bus for changing an output voltage along a curve determined by a phenomenon of resonance with said inductor when said semiconductors switching elements operate, causing abrupt changes of a voltage at said connection point;
    diodes for changing a current path at a time when said resonance goes approximately one quarter of period to thereby stop said resonance; and
    constant voltage diodes for absorbing energy stored in said inductor during said resonance.

2. A bridge-type power converter according to claim 1, wherein said constant voltage diodes connected to said positive and negative sides of said d.c. bus in each phase of a multiple phase bridge-type power converter are replaced by diodes forming a high-voltage or low-voltage priority circuit and diodes forming a backward current path, respectively.

3. A bridge-type power converter according to claim 1, wherein said constant voltage diodes are replaced by a constant voltage circuit which comprises transistors so as to provide a reverse conduction characteristic.

4. A bridge-type power converter according to claim 2, wherein said constant voltage diodes are formed by transistors.

5. A bridge-type power converter according to claim 2, which further comprises a chopper circuit for controlling voltages across capacitors which replace said constant voltage diodes and returning absorbed power to said d.c. bus.

6. A bridge-type power converter according to anyone of claims 1 to 5, which further comprises a.c. terminals connected to an a.c. power source for performing an a.c.-to-d.c. power conversion.

7. A bridge-type power converter according to claim 1, which further comprises a unit formed by additions to said switching elements and connected between said power converter and an electric motor or a power source.

* * * * *